(12) United States Patent
Goldberg et al.

(10) Patent No.: US 10,061,027 B2
(45) Date of Patent: Aug. 28, 2018

(54) LASER NAVIGATION SYSTEM AND METHOD

(71) Applicant: Adsys Controls, Inc., Irvine, CA (US)

(72) Inventors: Brian Scott Goldberg, Ladera Ranch, CA (US); Ryan Wayne Franz, Boulder, CO (US)

(73) Assignee: Adsys Controls, Inc., Irvine, CA (US)

( * ) Notice: Subject to any disclaimer, the term of this patent is extended or adjusted under 35 U.S.C. 154(b) by 509 days.

(21) Appl. No.: 14/630,580

(22) Filed: Feb. 24, 2015

(65) Prior Publication Data

US 2015/0241562 A1 Aug. 27, 2015

Related U.S. Application Data

(60) Provisional application No. 61/944,491, filed on Feb. 25, 2014.

(51) Int. Cl.
| | |
|---|---|
| *G01S 17/42* | (2006.01) |
| *G01S 1/70* | (2006.01) |
| *G01S 5/16* | (2006.01) |
| *G01S 17/93* | (2006.01) |
| *H01L 31/09* | (2006.01) |

(52) U.S. Cl.
CPC ............. *G01S 17/42* (2013.01); *G01S 1/70* (2013.01); *G01S 5/16* (2013.01); *G01S 17/933* (2013.01); *H01L 31/09* (2013.01)

(58) Field of Classification Search
CPC ....... G01B 11/03; G01C 15/002; G01S 17/66; G01S 5/163; G01S 1/70
See application file for complete search history.

(56) References Cited

U.S. PATENT DOCUMENTS

| | | | |
|---|---|---|---|
| 2010/0128259 A1* | 5/2010 | Bridges | G01B 11/03 356/138 |
| 2012/0265479 A1* | 10/2012 | Bridges | G01C 15/002 702/135 |

* cited by examiner

*Primary Examiner* — Luke D Ratcliffe
(74) *Attorney, Agent, or Firm* — Jonathan A. Kidney; CKR Law LLP

(57) ABSTRACT

A laser navigation system for measuring the position of a vehicle or object. An environmental housing with first and second optical windows contains a first laser source with a steering optic oriented to the first optical window; and a second laser source with a scanning optic oriented to the second optical window. A system controller operates the first laser source with at least one of modulation and signal encoding information and provides steering commands to the steering optic to generate at least three or more adjoining or near-adjoining differentiated steered beams, and operates the second laser source and scanning optic to provide a distance measurement information, wherein the position of a vehicle or object is determined from its angular location within the differentiated steered beams in combination with the distance measurement information.

19 Claims, 16 Drawing Sheets

LASER NAVIGATION SYSTEM AND METHOD

CROSS-REFERENCE TO RELATED APPLICATION(S)

This application claims the benefit of U.S. Provisional Patent Application No. 61/944,491, filed Feb. 25, 2014, the contents of which are hereby incorporated by reference in its entirety.

FIELD

The invention relates to measuring an object's position relative to a reference position allowing for relative or absolute positional measurements. More particularly, the use of laser energy to allow for such measurements without use of GPS, or radio frequency communications enabling navigation of aircraft, ground vehicles, spacecraft, or other object localization.

BACKGROUND

With advances in autonomy, reliance on navigational devices for vehicles (ground, airborne, or space-borne) is imperative. The Global Positioning System (GPS) is the ubiquitous choice for many applications, however, GPS has several shortcomings such as radio frequency (RF) interference, jamming, signal blockage, or GPS satellite outages.

GPS utilizes a constellation of satellites, emitting radio signals, to allow a receiver to ascertain position. Instrument Landing System (ILS) uses overlapping radio signals from a ground station to allow measurement of aircraft position relative to a single, predefined approach path. The Unmanned Common Automatic Recovery System (UCARS) and Tactical Approach Landing System (TALS) utilize ground-based radar with an airborne transceiver; to determine range and position relative to an approach path; the measurements are then conveyed to the aircraft over a radio link. The Optical Landing System (OLS) utilizes visible non-coherent lights arranged such that an approaching pilot sees different patterns depending on whether the aircraft is high, low, or off-center relative to the desired approach path. Below, Table 1.1 details the shortcomings of these systems.

TABLE 1.1

| Shortcoming | GPS | ILS | UCARS | OLS | TALS |
|---|---|---|---|---|---|
| High Radar Observability | | x | x | | x |
| RF Sensing or Communication Link Required | x | x | x | | x |
| Does Not Allow for Motion Compensation | | x | | x | x |
| High Airborne Complexity | | | x | | x |
| Unable to Deny Access to Unauthorized Users | x | x | | x | |
| Unable to Reconfigurable on the fly | | x | x | | x |
| No Three Dimensional Position Measurement | x | | x | | x |
| Precludes Use by Multiple Simultaneous Receivers | | | x | | x |
| Highly Susceptible to Jamming | x | x | x | | x |
| Does Not Provide Absolute Positional Measurements | | x | x | x | x |

Numerous attempts by others have been made to address these deficiencies, some using laser based systems. For example, U.S. Pat. No. 7,898,435 utilizes a transmitter on a vehicle, transmitting in three different directions. Reflected energy is analyzed, including Doppler shifts, to calculate altitude, ground speed, and relative wind. However, this system is not designed to measure position relative to a desired approach path, does not provide a communication method between the ground and the aircraft, and requires extensive aircraft equipment (multiple lasers in addition to sensors).

U.S. Pat. No. 4,925,303 utilizes two scanning beams originating from two different positions on an aircraft. A sensor, also on the aircraft, receives reflections from a known pattern of reflective targets on the ground to determine position, speed, and distance from the runway. However, this system relies on existing technology (ILS or MLS) to gain proximity to the runway, requires extensive ground setup, is not reconfigurable on the fly for different approach requirements, requires extensive aircraft equipment (multiple lasers in addition to sensor(s)), requires both an airborne transmitter and receiver, requires bi-directional light propagation, and does not provide a secure communication link between the ground and the aircraft.

U.S. Pat. No. 5,043,726 utilizes ground-based lasers, spatially separated. An angular and spectral sensor on the aircraft senses the incoming angles of the multiple lasers and thereby determines aircraft position relative to the lasers using triangulation. However, this system suffers from loss of precision at reasonable ranges, requires more extensive ground equipment (multiple lasers with significant spatial separation), uses a different method for beam sensing, is not easily reconfigurable, and does not provide a secure communication link between the ground and the aircraft.

U.S. Pat. No. 5,287,104 utilizes visible lasers of three defined colors, projected in a known pattern, to allow a pilot to determine position relative to approach path; this is essentially a laser-based version of the OLS system used on aircraft carriers. However, this system is specifically designed for human eye sensing, not machine sensing; relies on multiple beams of different wavelength; and does not provide any range-to-go information.

In view of the shortcomings listed above, alternative system(s) and method(s) for precision navigation are needed, specifically ones that do not rely on the RF spectrum. Details of such system(s) and method(s) are elucidated in the following description.

SUMMARY

The following presents a simplified summary in order to provide a basic understanding of some aspects of the claimed subject matter. This summary is not an extensive overview, and is not intended to identify key/critical elements or to delineate the scope of the claimed subject matter. Its purpose is to present some concepts in a simplified form as a prelude to the more detailed description that is presented later.

The present disclosure relates to techniques for navigational position measurements by using two or more steerable laser beams originating from a reference location and a sensor on an object/vehicle to detect said laser beams. These techniques can be used for navigational assistance and recovery of aircraft, land vehicles, ships, spaceships and so forth.

In one aspect of the present disclosure, a laser navigation system for measuring the position of a vehicle or object is provided, comprising: an environmental housing with first and second optical windows; a first laser source with a steering optic oriented to the first optical window; a second laser source with a scanning optic oriented to the second optical window; and a system controller, wherein the controller operates the first laser source with at least one of modulation and signal encoding information and provides steering commands to the steering optic to generate at least three or more adjoining or near-adjoining differentiated steered beams, and operates the second laser source and scanning optic to provide a distance measurement information, wherein the position of a vehicle or object is determined from its angular location within the differentiated steered beams in combination with the distance measurement information.

In other aspects of the present disclosure, the system above further comprises an adjustable lens between the first laser source and the first optical window, adapted to provide at least one of controllable beam size, beam divergence, and beam shape, wherein the steering optic is at least one of a steerable mirror, rotating polygon mirror, galvanometer, optical modulator and movable lens; and/or a plurality of fixed angled first laser sources; and/or at least one of a ranging sensor, optical calibration sensor for laser alignment and precision measurement, an inertial measurement sensor, and a global positioning system (GPS) sensor; and/or one or more receivers located on a vehicle or object to be measured, wherein the one or more receivers has at least one of multiple receiving optical apertures, multiple optical detectors for sensing received laser energy, optical lenses, optical attenuators, processing electronics for decoding receiver laser messages and computing a vehicle position in a relative or absolute reference frame; and/or a receiver located on a vehicle or object to be measured; and multiple sensors for at least one of increasing the sensing field of view of the receiver, increasing the dynamic range of the receiver, measuring different laser wavelengths, and measuring different laser polarities; and/or whereby the receiver is further comprised of multiple optical receivers utilizing different levels of fixed or adjustable optical attenuation and/or polarization through the use of at least one of optical attenuating filters, beam splitters, polarizers, optical shutters, and non-linear photosensitive optics.

In yet another aspect of the present disclosure, a method for measuring the line of sight position and physical range of a vehicle or object is provided, comprising: propagating a steered laser or multiple lasers (guidance beams) at various propagation angles from a transmitting station; propagating a spatially separated scanned laser (distance beam) within the guidance beams propagation angles from the transmitting station; and receiving in a receiving unit, the laser received signal from the guidance and distance beams to determine a line of sight position measurement of the vehicle or object.

In other aspects of the present disclosure, the method's line of sight position measurement is determined from either a differential power measurement of multiple temporally spaced guidance beams, differential power measurement of multiple spatially separated guidance beams, power measurement of a single guidance beam within a field of multiple temporally spaced guidance beams, or power measurement of a single guidance beam within a field of multiple spatially separated guidance beams; and/or propagating the guidance and distance beams from multiple transmitting stations; and triangulating the received signal from the multiple transmitting stations to determine a three dimensional position of the receiver; and/or conveying data within the guidance beams using at least one of time modulation, pulse width modulation, amplitude modulation, phase modulation, frequency modulation, and polarity modulation; and/or wherein the data includes at least one of line of sight propagation angles of a respective beam in a relative coordinate frame to a reference station, line of sight propagation angles of a respective beam in an absolute coordinate frame location of a reference station in an absolute reference frame, identifying information of a reference station transmitting the data for deconfliction with other reference stations, angular position or time synchronization of a scanned laser used for distance measurement, communication data for vehicle commanding or reconfiguration, airport or landing area information, and user-configurable data or messaging; and/or wherein the data is encrypted to mitigate receipt and use by an unauthorized party; and/or shaping the distance beam such that it is narrow in a direction of the scan and covers a wide angle in a direction orthogonal to the scan direction; and shaping the guidance beams such that a single beam power profile is proportional to an angular offset from a guidance beam's laser center, wherein a waveband of the beams is in one or more of a visible, infrared, ultraviolet, or extreme ultraviolet wavebands; and/or dynamically altering a beam propagation configuration, including beam divergence, scanning rates and beam angular position, for changes in navigational coverage area, measurement update rate, or atmospheric propagation, as a result of operator input or vehicle/object range measurements; and/or compensating propagation of the distance and guidance beams from motion of a source platform; and/or the distance beam from the guidance beam and deconflicting signals from different transmitting stations using at least one of temporal separation, wavelength difference, polarization, forward error correction, and unique data messaging; and/or using an optical, radio frequency, or hard-wired communication link between transmitting stations for time synchronization and/or respective transmitting station orientation; and/or initially acquiring the receiving unit, by transmitting a scanning pattern from the transmitting station, and confirming acquisition through detected returned power or acknowledgement of receipt by the receiving unit via a separate communications link to the transmitting station.

DETAILED DESCRIPTION

Figure 1:
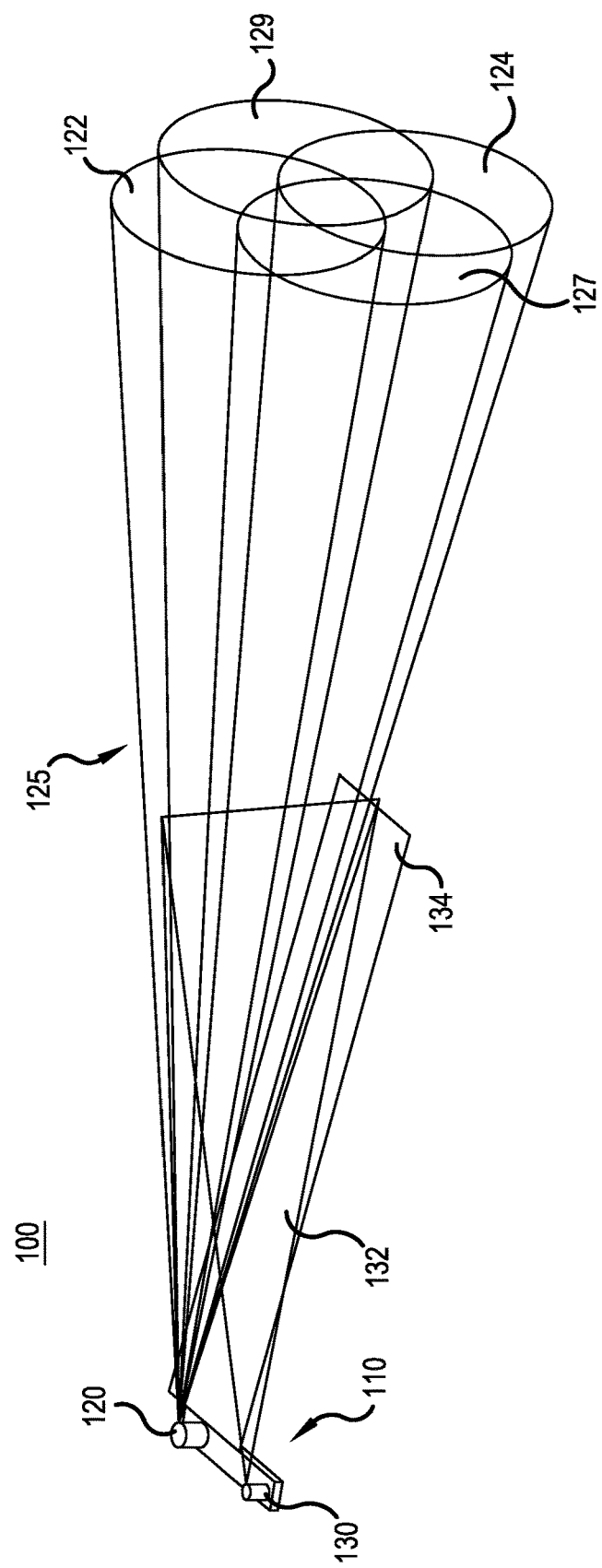
FIG. 1 shows an LANS installation with GLB beamlets and DLB laser propagating from a ground based LANS Reference Station.

For certain critical aircraft operations, precise knowledge of aircraft position is required. For instance, for landing, relative position to the touchdown location (ground, ship, or other platform) is required for safe vehicle recovery. In the fields of manned aviation and unmanned aviation, various techniques are prevalent to provide such measurements. It is understood that one or more of the following drawbacks are evident in the prior art:

Does not provide for low radar observability for covert operations.
Requires presence of an uplink or bidirectional RF communication link.
Cannot compensate for motion of the reference location (e.g. ship)
Requires a large gimbal system.
Requires significant airborne equipment investment or logistics.
Requires significant ground station equipment logistics.
Does not preclude intended use by unauthorized users.
Cannot be reconfigured in real time for alternate trajectories.
Does not provide high accuracy.
Does not provide three-dimensional positional information.
Does not support communication with the receiver (e.g. for "fleet" management).
Does not operate in inclement weather conditions.
Does not support day and night operations.
Does not allow for use by multiple receivers.
Susceptible to hostile jamming.
Requires reflection of signals from the aircraft or ground, implying higher electromagnetic power requirements as well as risk of sensing reflections from unintended objects.
Does not support absolute (e.g. latitude/longitude/altitude) positional measurements.

The present disclosure addresses many of the above deficiencies as it relates to techniques for navigational position measurements by using two or more steerable laser beams originating from a reference location and a sensor on an object/vehicle to detect said laser beams. The entire system will henceforth be referred to as the Laser Aided Navigation System (LANS).

Although a number of discrete embodiments are described below, it is to be understood that these are merely non-limiting examples, and that any given embodiment of the subject matter may comprise some of the features of one shown embodiment, and/or some of the features of another shown embodiment. Other modifications between embodiments will be clear to one skilled in the art upon reading the following disclosure.

The following descriptions are described in the context for recovery of an aircraft, however, the application is applicable to any navigational application where knowledge of an object's absolute or relative position is required. For example, the described systems and methods are applicable to aircraft for navigation, vehicle recovery/landing, formation flying, or in-flight docking. It is also applicable to ground vehicles, either in an outdoor or indoor environment, for navigation or relative operations such as vehicle following or docking, as well as for sea-faring vehicles (e.g., ships). Spacecraft can benefit from the technology for formation flying or docking. A broader use for other objects is envisioned for such uses as measurement of building sway, mobile device localization, or any application where relative or absolute positional knowledge of an object is required. In this description, aircraft navigation applications are presented, however, it is understood to be applicable for other navigation/positional situations.

For example, in one aspect of an embodiment, laser(s) originating from a reference station (e.g. at an airport or ship) are steered to cover a broad area; the lasers provide communication data indicating navigational information in regards to their orientation relative to the reference station as well as the reference station's absolute location; an aircraft in this broad area can thereby discern both absolute position (e.g. lat/long/alt) and relative position to the reference station in three dimensions.

In another aspect, the system may be used by an aircraft autopilot to execute a precision landing without any radio-frequency communication, and without any information sent from the aircraft to the ground. Another such use would be the measurement of relative location of any two maneuvering objects, such as in satellite proximity operations, aircraft refueling, aircraft formation flying, or ground vehicle convoy operations. Various embodiments can be used for general navigation of a vehicle or position estimation of an object.

Such capabilities for position measurement may be achieved by one or more of the following features, alone or in combination, although other features may be clear to one of skill in the art upon reviewing the present disclosure:

a LANS reference station (LRS) used to propagate lasers with encoded signals for navigational measurement;
a LANS receiver located on a vehicle or object which measures the received laser signals and computes relative and/or absolute navigational position;
a steerable Guidance Laser Beacon (GLB) which originates at the LANS reference station, and can be modulated to encode information including, but not limited to, the current GLB angle relative to an absolute (earth-fixed) reference frame, current GLB angle relative to the reference station, reference station location, information to determine the pointing and/or timing of the Distance Laser Beacon or other related timing references;
a steerable Distance Laser Beacon (DLB) laser which originates at the LRS at a known physical offset from the GLB and can likewise be modulated to encode information including offset distance from the GLB and current DLB propagation direction relative to the reference station or absolute Earth reference frame;
optics located within the LANS reference station for steering of the GLB and DLB lasers;
optics located within the LANS reference station which provide precision angular calibration and timing between the GLB and DLB lasers;

optics within the LANS reference station to allow for adjustable divergence of the GLB output;

optics within the LANS reference station to allow for shaping of the DLB laser output;

sensors within the LANS reference station used to measure inertial motion and absolute position;

a sensor within the LANS reference station to measure the range to the LANS receiver using laser time of flight measurements;

electronics within the LANS reference station which provide any or all of the following: control of steerable optics, laser modulation, control of gimbals or optics for motion compensation, measurement of vehicle range, and control of optics for laser output beam shaping;

One or more sensors on the vehicle or object which can sense incident power levels, sensing field of view, increase dynamic range of the receiver, measure different wavelengths, polarities, etc., of both the GLB and DLB lasers as well as the modulation of the lasers;

electronics on the vehicle or object which decode data encoded in the GLB and DLB lasers and compute angular position and distance to the reference station as well as absolute position in an Earth reference frame; and methods to adjust the GLB and/or DLB scan patterns and beam output shape to achieve desired coverage zone size, atmospheric propagation, measurement update rates, and measurement accuracy, operator input, vehicle or object range measurement.

The present disclosure is also directed to methods and/or systems for performing precision navigation in a typical environment where multiple vehicles may require deconfliction and various LANS reference stations may be in use in an overlapping coverage area. In some aspects, the methods and/or systems could include one or more of the following steps:

encoding information in the GLB and/or DLB which may include LANS reference station identifier;

encoding information in the GLB and/or DLB which may include landing zone/runway information including, but not limited to, landing zone identifier, runway bearing, approach path, and runway length; and encoding information in the GLB and/or DLB for specific vehicle communication which may include vehicle identifier(s), vehicle command type, and vehicle command data.

For embodiments where the operation may occur over a broad extent of physical ranges between the LRS and LANS receiver, methods and systems may be used to allow for the large dynamic range of the incoming laser energy. In some aspects, the methods and/or systems may include one or more of the following steps:

use of multiple optical sensors within the LANS receiver with optics for operations at various incoming power levels; and use of actively controlled optical attenuators within the LANS receiver for adjusting the amount of energy incident on the optical detector.

For embodiments where the LANS receiver is at an appreciable distance from the LRS, a large laser separation distance to support triangulation can be used for an accurate three-dimensional position solution. This may be accomplished by separating the GLB and DLB into separate physical enclosures, or by utilizing two physically separated GLB lasers. In some aspects, the methods and/or systems may include one or more of the following steps:

use of two physically separated reference stations with a GLB laser and DLB laser respectively;

use of two physically separated reference stations each with a GLB laser, means to deconflict the simultaneous receipt of multiple GLB/DLB lasers through means of wavelength separation, laser polarization, time synchronization, or forward error correction techniques;

use of a laser communication crosslink between two physically separated reference stations supporting time synchronization and relative positional measurements of the respective output lasers; and use of a RF communication crosslink between two physically separated reference stations supporting time synchronization and relative positional measurements of the respective output lasers;

In the following detailed description, reference is made to the accompanying drawings, which form a part hereof, and in which are shown by way of illustration specific embodiments in which the subject matter may be practiced. In this regard, terminology such as "first," "then," "afterwards," "before," "next," "finally," "above," "below," "top," "bottom," "front," "back," "leading," "trailing," etc., is used with reference to the drawing being described. Because the processes and methods of the present subject matter can be performed in a number of different orders, and because the individual elements of the apparatus and systems of the present subject matter may be configured in a number of different orders, the above terminology is used for purposes of illustration and is in no way limiting. It is to be understood that other embodiments may be utilized and logical changes may be made without departing from the scope of the present subject matter.

Making reference to FIG. 1, an embodiment is illustrated 100 showing a ground element referred to as the LANS Reference Station (LRS) 110, or reference station, containing both a Guidance Laser Beacon (GLB) 125 and Distance Laser Beacon (DLB) 135 with supporting optics, sensors, mechanisms and electronics (shown here as 120 and 130, respectively). Both the GLB 120 and DLB 130 are formed by lasers, which may be steered precisely to different angles and modulated to convey information. The GLB and DLB are positioned at a physical offset of a known distance. The beams from the LRS 110 are shown here with a common overlapping sector at the "midpoint" of the beams. While four beams 122, 124, 127, 129 are shown as the constituent beams for the GLB 120, more or less beams may be utilized according to design preference. The projected DLB beam 132 intersects the GLB beams 122, 124, 127, 129.

The various beams may be projected in a manner indicative of the approach path to a landing area 134. Further, the various beams may be of different frequencies as well as polarization. It should be understood that the lasers used in the embodiments described herein may be configured to operate in any one or more of the visible, infrared, ultraviolet, or extreme ultraviolet wavebands with a beam profile proportional to the angular offset from the laser center. For example, the laser beam power profile can be configured to be proportional to the angular offset from the laser center, such as a Guassian beam shape or other desired profile.

Figure 2:
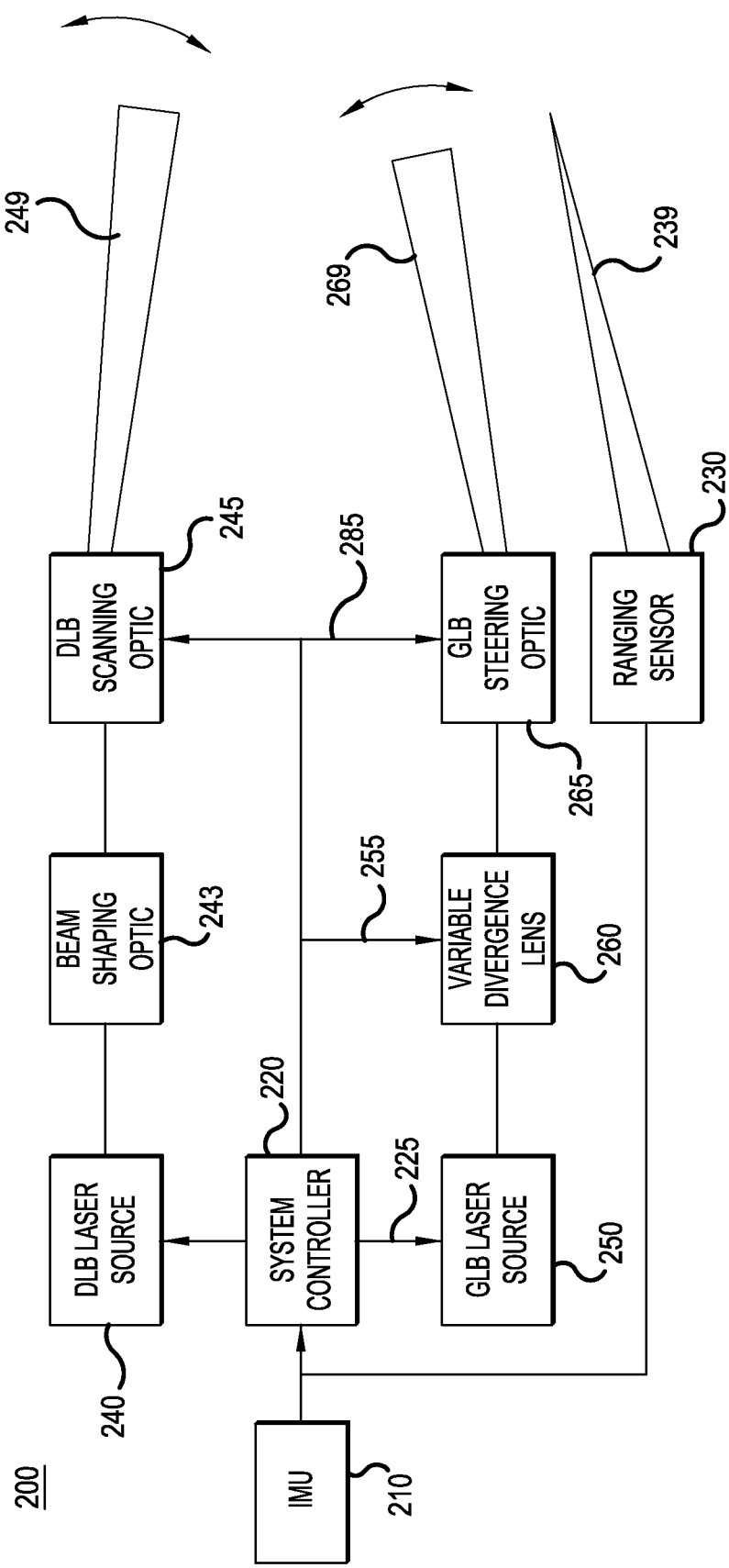
FIG. 2 shows the primary components and interfaces for a particular LANS Reference Station implementation.

FIG. 2 is an illustration 200 of an embodiment of one possible LRS configuration identifying the primary components and electrical and optical interfaces. Beginning with the GLB system, the GLB laser source 250 is controlled by a system controller 220 for proper modulation 225 for signal encoding. The GLB laser is passed through an optionally adjustable lens system 260 allowing for the desired beam size, beam divergence and beam shaping based on system parameters. The system controller 220 provides divergence settings 255 and other parameters, as needed to the adjustable lens system 260. The GLB laser is steered using a GLB steering optic 265, which can be controlled from system controller 220 with steering commands 285. The GLB steering optic 265 may be a steering mirror, galvanometer, multiple galvanometers, adjustable prisms, acoustic modulator, or other mechanism to allow the output beam to be accurately positioned. The system controller 220 can control the GLB steering optic 265 to various positions, each of which a set of encoded laser pulses is transmitted forming a "beamlet" 269. Multiple GLB beamlets 269 can be propagated at various angles to provide a coverage area. In some embodiments, the multiple lasers can be used for each beamlet 269 minimizing or obviating the need for a GLB steering optic 265.

For the DLB system, a DLB laser source 240 is additionally controlled by the system controller 220 to produce time-focal plane pulses to the GLB output. The DLB laser is passed through beam shaping optics 243 which provide the desired beam size, shape, and divergence. Nominally, the DLB beam 249 is fan-shaped (tall and narrow in a direction of the scan, with a wide angle in the direction orthogonal to the scan direction) but can have other shapes as well. DLB scanning optic 245 generates the DLB output beam 249 for the desired output angular scan pattern. The DLB scanning optic 245 may be a steerable mirror, rotating polygon mirror, galvanometer, optical modulator, movable lens, adjustable prism, or other steering optic. The DLB scan pattern is nominally swept across the coverage area as defined by the GLB scan pattern, which can be provided from the system controller 220 steering commands 275.

When the LRS is located on a moving platform, the use of an Inertial Measurement Unit (IMU) 210 may be used for motion compensation. Motion compensation is implemented through the system controller 220 and could control a gimbaled platform within the LRS as well as augment the DLB and GLB optics (245, 265) for steering the beams relative to an inertial frame as measured by the IMU 210. Possible non-limiting examples of compensation can be achieved via a motion sensor such as a gyro, accelerometer, GPS sensor, encoder, hall effects sensor, mechanical gimbal. Additionally, the LRS may be instrumented with a GPS receiver, or other absolute position sensing device, in order to convey the position of the LRS to the LANS receiver for computation of the LANS receiver's position in an absolute position frame.

A ranging sensor 230 may be used to measure the distance to a vehicle/object in the field based on time of flight of the return signal 239 of the GLB and/or DLB lasers; and may be under control/feedback to the system controller 220. The ranging sensor 230 could be an avalanche photo diode (APD), photodetector, photomultiplier tube, or similar optic sensing device. The setting of the variable divergence lens 260 may be adjusted based on operator system parameters to optimize for operational range capability, coverage area size, atmospheric conditions, and measurements update rates. Additionally, the variable divergence setting may be adjusted as a function of the ranging sensor 230 measurements such that the divergence is expanded when the vehicle/object as closer to the LRS.

Figure 3:
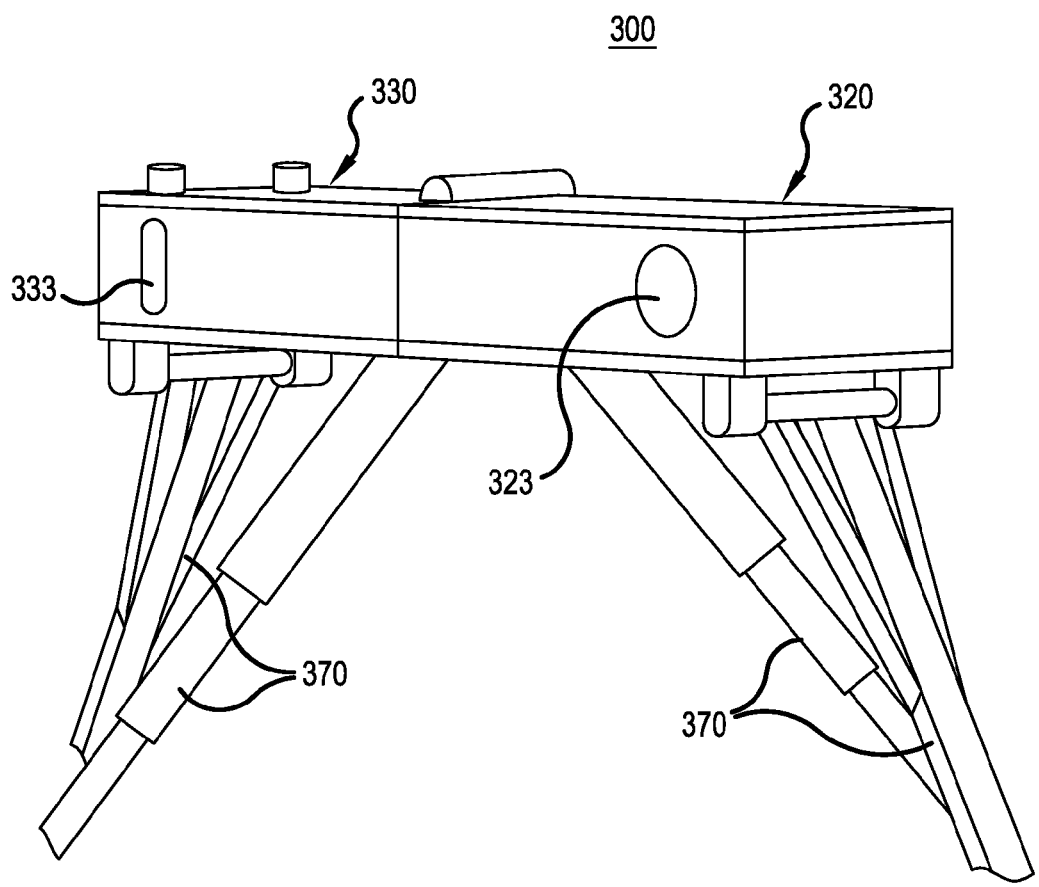
FIG. 3 shows a design for a ground-based compact LRS.

FIG. 3 is an illustration 300 of a conceptual embodiment for the LRS for a compact mobile, singly housed implementation. Optical windows 323, 333 are shown for the GLB system 320 and DLB system 330 outputs, respectively. For the mobile LRS, the unit could have adjustable legs 370 for stable emplacement and leveling. Additionally, the unit could be folded for easier transportation and carrying.

While FIG. 3 illustrates an embodiment with the GLB and DLB systems 320, 330 co-located within a single housing, the DLB system 330 and GLB system 320 may be separated into independent physical enclosures with an optical or other high speed sensor used for time synchronization and relative laser angular pointing alignment. Further, a radio frequency, or hard-wired communication link between transmitting stations may be implemented for time synchronization and/or respective transmitting station orientation. Thus, various changes and modifications to the configurations shown may be made without departing from the spirit and scope of this disclosure.

Figure 4:
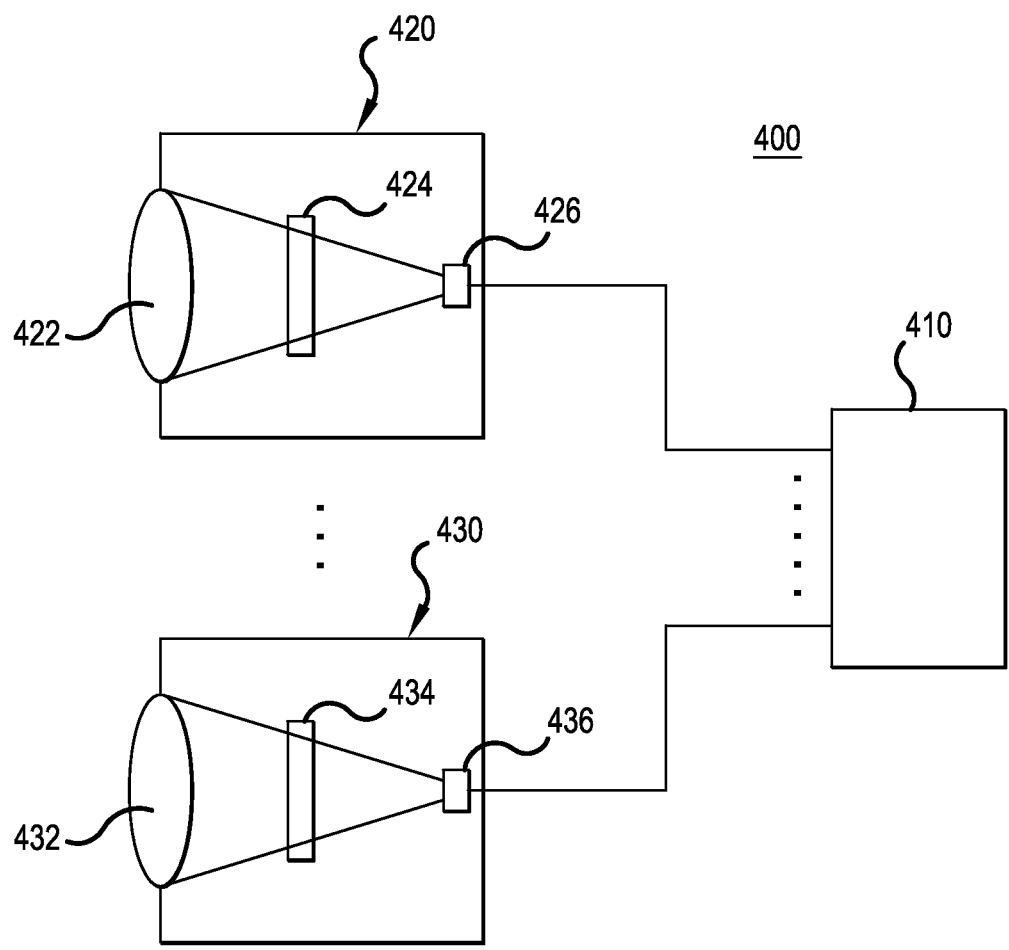
FIG. 4 shows an example implementation of the LANS receiver.

FIG. 4 is an illustration of a LANS receiver 400 for vehicle or object measurement. The LANS receiver 400 may be comprised of multiple optical receivers 420, 430 each containing the following elements: one or more optical lenses 422, 432, an optical detector 426, 436, and fixed or variable optical attenuators 424, 434. While not shown, the LANS receiver 400 may utilize different levels of fixed or adjustable optical attenuation and/or polarization through the use of optical attenuating filters, beam splitters, polarizers, optical shutters, non-linear photosensitive optics, and so forth. The LANS receiver 400 also contains processing electronics 410 for signal amplification, reading the sensor signals, and signal processing. The LANS electronics 410 hosts associated firmware for computing the relative and/or absolute position, as well as interpretation of any additional communication data through the GLB/DLB transmissions.

Figure 5:
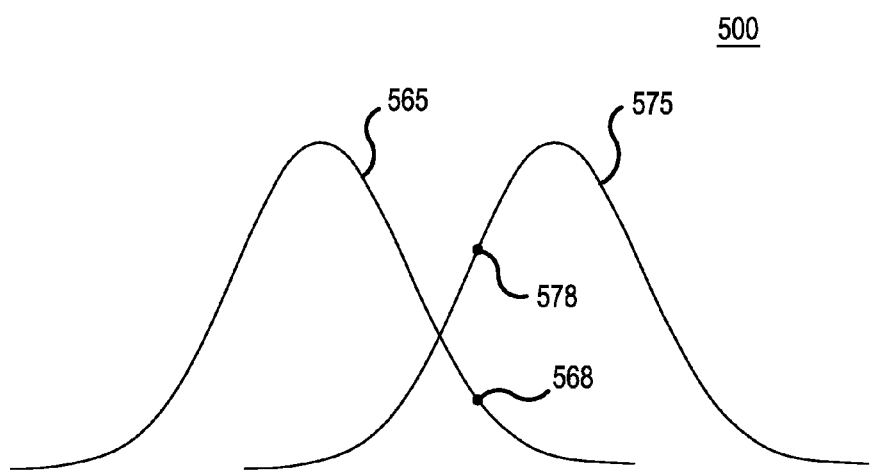
FIG. 5 illustrates an example of how the LANS receiver determines the angular solution from multiple laser beams at different known angles.

FIG. 5 is an illustration of a one-dimensional example of the basic sensing principle of the GLB for determining the LANS receiver angular location from the LRS. To accomplish this, the vehicle sensor measures the relative power of multiple GLB beamlet signals 565, 575 at different angular offsets. In this example 500, the power profiles of two angularly separated GLB beamlets 565, 575 are shown. In this case, there is a left beamlet 565 and a right beamlet 575. In this example, the beamlets 565, 575 have typical Gaussian beam profiles, though other profiles which are monotonically shaped about the center are possible. A vehicle located closer to the right beamlet 575 will measure power levels indicated by the two dots 568, 578. The higher powered measured 578 from the right beamlet 575 indicates the vehicle is right of the center (potentially the ideal approach path), and the specific values can be used to approximate the angular error based on beam profile calibration data. Other GLB propagation angles in the vertical axis enable vertical position measurements as well. Discrimination or differentiation between the beamlets at different angles may come through encoding schemes, change in polarization, change in frequency, or other beam-distinguishing attributes, according to design preference.

Of course, the terms right and left are relative and it is understood that top and bottom or up or down may be used as alternatives to right and left, depending on design implementation.

Figure 6:
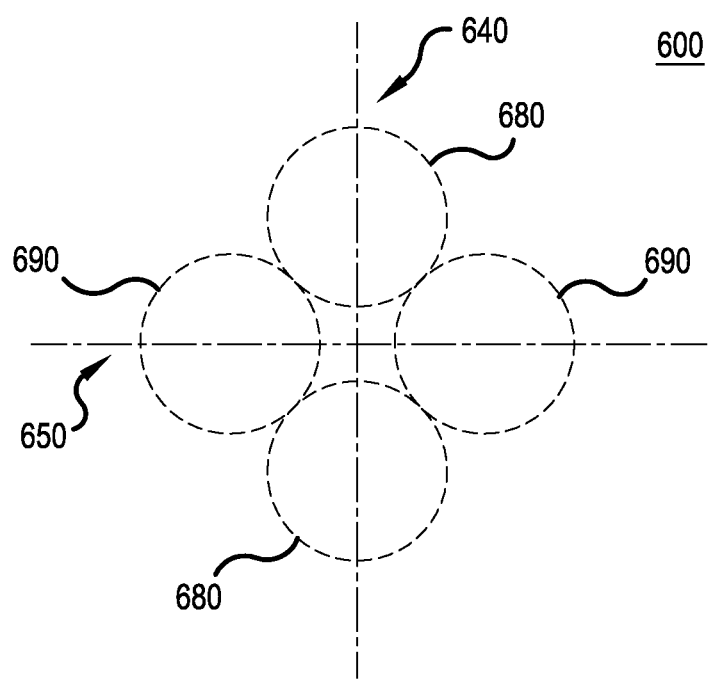
FIG. 6 shows a simple four-beamlet GLB pattern, which may be formed by the LRS.
Figure 7:
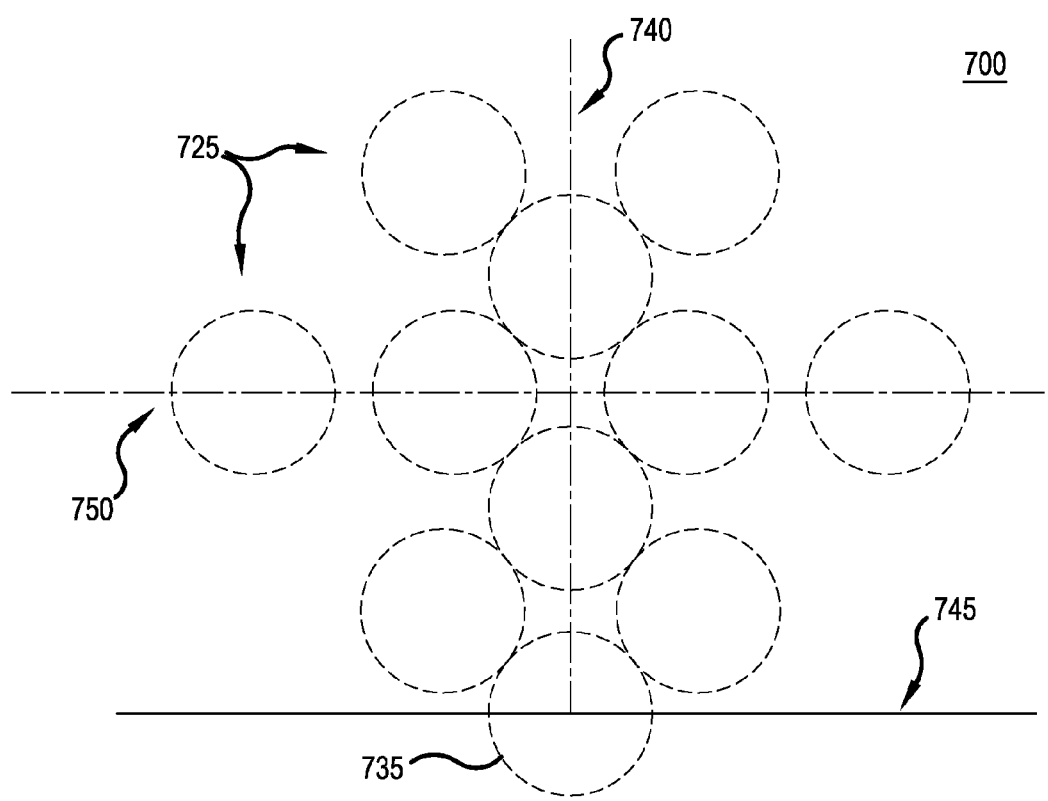
FIG. 7 shows a larger eleven-beamlet GLB pattern, which may be formed by the LRS.

FIG. 6 is an illustration 600 of a simple four-beam scan pattern of the GLB, while FIG. 7 is an illustration 700 of a larger eleven-beam scan pattern. In the four-beam pattern of FIG. 6, the angle between the individual beamlet 680, 690 can be chosen to achieve the desired navigational coverage area and be optimized about the vehicle's desired glide slope 650 and lateral glide path 640 angles. Making reference to FIG. 7, a larger beamlet pattern can be used for a larger coverage area. In the instance where LANS is used for vehicle landing, additional angular beamlet positions may be needed (for example, additional low beams 735 may be required close to or below the horizon 795 for the vehicle to maintain guidance through landing and taxiing operations). In some embodiments, less than four-beams may be utilized, for example, a three-beam pattern, depending on design implementation.

It should be noted that the actual beams will form an overlay of beams (for example, as seen in FIG. 1) of adjoining and overlapping beams, therefore the exact shape and positioning of the beams shown in FIGS. 6-7 are for illustrative purposes.

Figure 8:
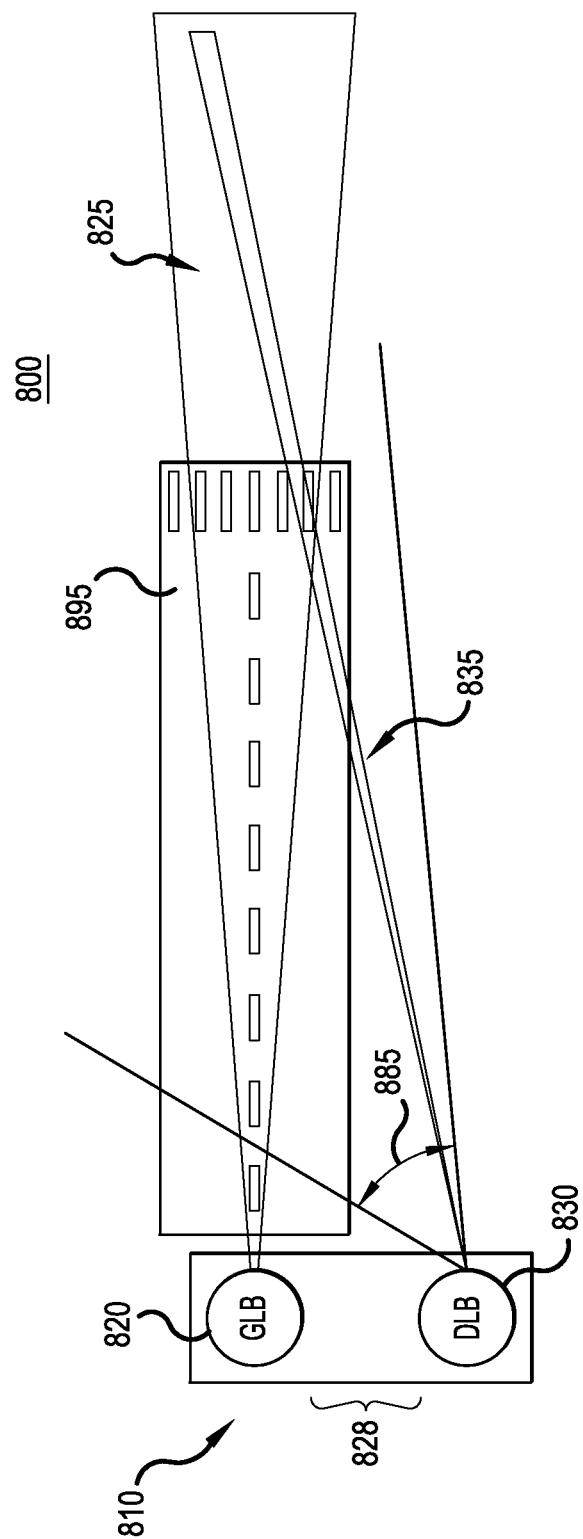
FIG. 8 is an illustration of an LRS with GLB and DLB sending respective beams over an airfield runway.

FIG. 8 is an illustration 800 of an LRS 810 with GLB 820 and DLB 830 sending respective GLB beam(s) 825 and DLB beam(s) 835 over an airfield runway 895. The DLB 830 adds distance measurement to the angular information obtained from the GLB 820. The DLB 830 can be swept continuously across an angular scan range 885. For the case of vehicle recovery, this may coincide with the approach path to the airfield 895. An approaching vehicle will sense the DLB beam 835 at a certain point during the scan; information encoded in the GLB beam(s) 825 and/or DLB beam(s) 835 reveal the DLB beam(s) 835 angle at the time of sensing. This angle, in combination with knowledge of the GLB/DLB separation distance 828, allows the vehicle to calculate distance from the GLB 820 and thereby distance from the LRS 810.

Figure 9:
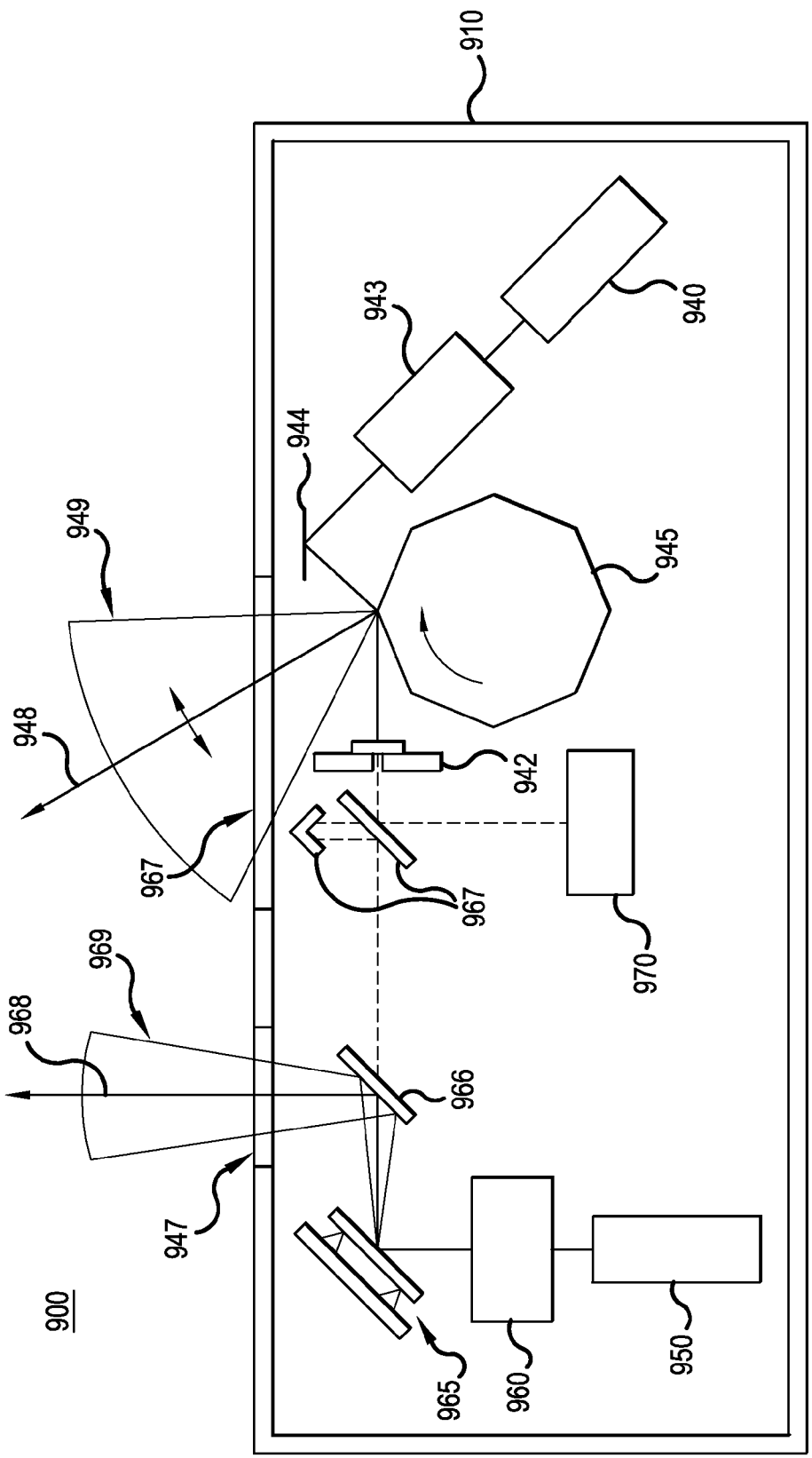
FIG. 9 is an illustration of possible components for an exemplary LRS system.

FIG. 9 is an illustration 900 of possible components for an exemplary LRS system, in operation, including the GLB laser 950 and DLB laser 940, optics 960, 965, 966, 967, 943, 944, 945, 947, and alignment sensor 970. In this embodiment, an alignment sensor 970 may be used to precisely calibrate/measure the DLB beam 948 and GLB beam 968 propagation angles. The GLB laser 950 is put through shaping optics 960 to shape the beam and set the output divergence. A GLB steering optic 965 is used to steer the GLB beam 968 over the entire GLB scan zone 969. The DLB laser 940 is put through DLB shaping optics 943 to shape the beam. A DLB steering optic 945 is used to steer the DLB beam 948 over the entire DLB scan zone 949. In this embodiment, an optical turning flat 944 is used to inject the DLB beam 948 onto the DLB steering optic 945.

The GLB beam 968 is brought into the alignment sensor 970 through a set of beam splitters 966, 972 which sample a small portion of the total GLB laser 950 power. Using the GLB steering mirror 965, the GLB beam 968 may be placed within the alignment sensor's 970 field of view and/or precisely measured. This measurement is used to calibrate any errors in the GLB steering mirror's 965 position sensors. During the DLB scan 949, the DLB beam 948 may be injected into the alignment sensor 970 via baffling 942 and beam splitter 972. The alignment sensor 970 measurement of the DLB beam 948 is used to calibrate the DLB scanning optic 945 position sensors (in the embodiment shown, the scanning optic 945 is a rotating polygon mirror). In this embodiment, the entire LRS can be placed within a common enclosure 910 with optical windows 947, 967 for transmission of the GLB beams 968 and DLB beams 948.

The GLB and DLB beams (968, 948) can be encoded to transmit information to the LANS receiver (not shown). This information may include the LRS unit identification (in the event multiple LRS units are transmitting information), the azimuthal angular direction of the GLB beamlet, the elevation angular direction of the GLB beamlet, and synchronization information for determining the pointing angle of the DLB. In some embodiments, a portion of the communicated message may be used for other data transmissions (e.g. LANS receiver identification for targeted messages, LRS position/altitude, vehicle commands, LRS motion information for ship-based units, message formats, data checksums, etc.).

In some embodiments the message can be encoded using a pulse position modulated signal. In other embodiments, the signal encoding may be phase-shift keying, pulse-amplitude modulation, or other time, phase, polarization, or amplitude communication modulation method. These modulation or encoding forms can be used for beam-to-beam discrimination. The encoding may also provide line of sight propagation angles of a respective beam in a relative coordinate frame to a reference station, line of sight propagation angles of a respective beam in an absolute coordinate frame (e.g. relative to North and Earth horizon), location of a reference station in an absolute reference frame (e.g. latitude/longitude/altitude), identifying information of a reference station transmitting the data for deconfliction with other reference stations, angular position or time synchronization of a scanned laser used for distance measurement, communication data for vehicle commanding or reconfiguration, airport or landing area information, and user-configurable data or messaging. Signal encoding is a well-known art, therefore other encoding schemes may be used without departing from the spirit and scope of this disclosure.

In one embodiment, the GLB laser 950 is physically steered to each beamlet 968 position. Time is allocated between beamlet transmissions to allot for the GLB steering optic 960 to reposition the beamlet 968 to the desired angular propagation. In other embodiments, multiple GLB lasers may be used for each beamlet in which case a GLB steering optic is not necessary.

In various embodiments it may be necessary to deconflict the receipt of the GLB and DLB beams at the LANS receiver. In certain embodiments, this may be achieved by temporally interleaving the DLB and GLB output pulses. The use of independent GLB and DLB laser repetition rates may be used to minimize the simultaneous GLB and DLB transmission and signal ambiguity at the LANS receiver. Additionally, a DLB pulse mask may be used at which the DLB laser pulse is suppressed when in conflict with the GLB message stream. In certain embodiments, a GLB blanking period may be used in which GLB transmissions are halted to allow for DLB signal transfer. In other embodiments, the GLB and DLB deconfliction can occur through the use of spectral separation, distinct laser polarities, temporal separation, wavelength separation, forward error correction, unique data messaging, and so forth.

For the purpose of long range precision navigation, the measurement of range is highly dependent on the physical separation of the GLB and DLB output beams at the LRS. In certain embodiments, instead of both the GLB and DLB lasers and associated optics being housed in a common enclosure, the units may be split into separate GLB and DLB units so that the physical separation can be increased. For instance, the GLB and DLB can then be placed on opposite sides of a runway. In this instance, the two units may require communication such that the two laser outputs are time synchronized and also such that the DLB pointing information can be properly encoded in the laser signals such that the LANS receiver can properly interpret the data for range measurement. This cross communication between GLB and DLB units may be via a RF communication link, hard wire, or through optical sensing. In the instance of GLB/DLB unit communication via optical sensing, one approach may be an optical sensor on the GLB which senses the DLB laser during its scan. The GLB can time synchronize based on the optical measurement.

Figure 10:
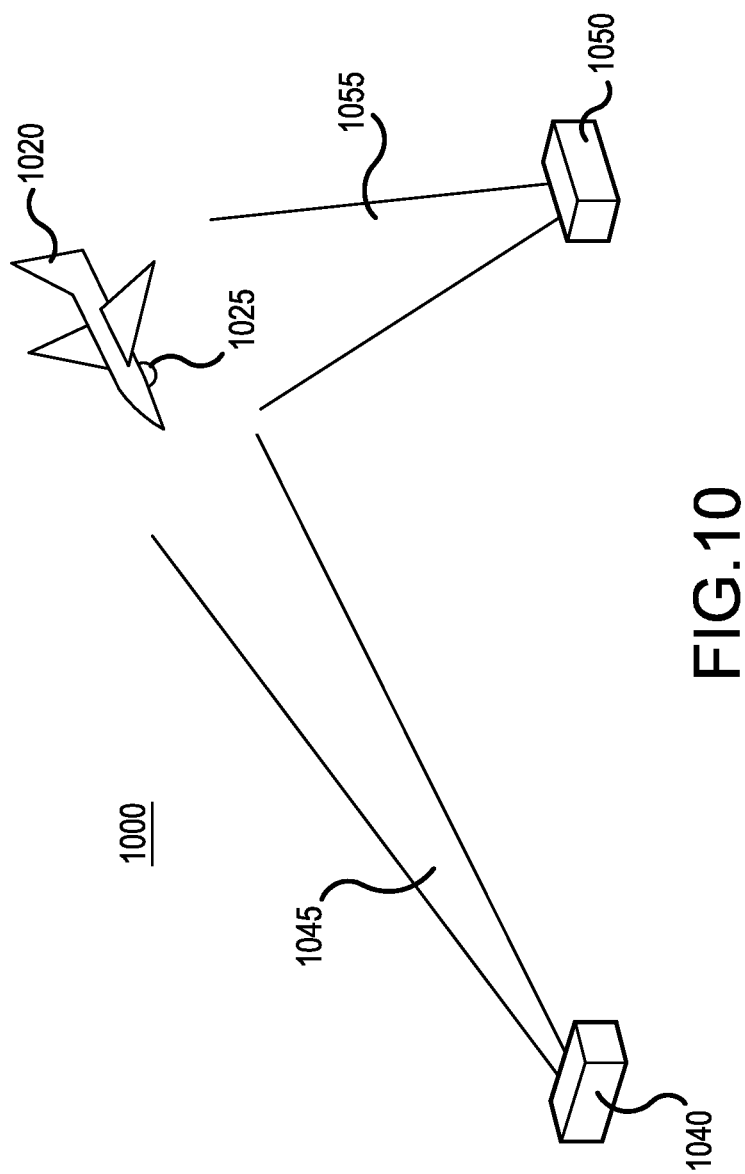
FIG. 10 is an example of how multiple GLB beams from separate LANS Reference Stations can be used to determine position using triangulation of the individual solutions.

FIG. 10 is an illustration 1000 of multiple GLB-only LANS Reference Stations, typically used at operational ranges where it is impractical to have the GLB and DLB units in close proximity. In this instance, a LANS receiver 1025 is located on the vehicle 1020 which measures the signals 1045, 1055 from two or more non-collocated LRS GLB units 1040, 1050. The LRS receiver 1025 uses triangulation to determine the vehicle 1020 position relative to the LRS units 1040, 1050. With the LRS units 1040, 1050 conveying their absolute position in the GLB message stream, the LANS receiver 1025 can additionally determine its position in an absolute reference frame (e.g. Earth frame such as latitude/longitude/altitude).

Figure 11:
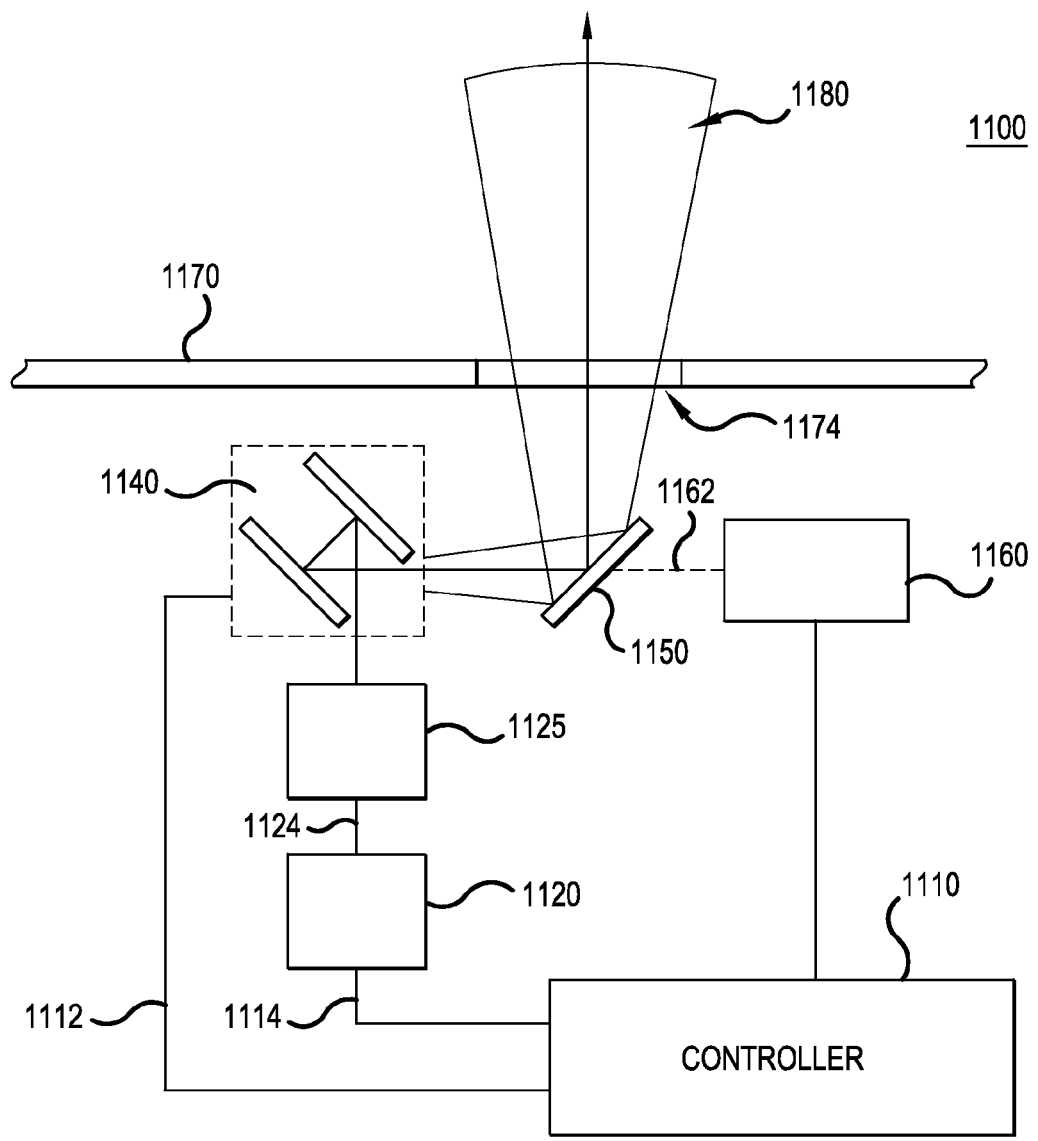
FIG. 11 shows an example implementation of an LRS using only GLB propagation.

FIG. 11 is an illustration 1100 of a possible embodiment architecture of a GLB-only LRS unit. In this embodiment, laser source 1120 is controlled by system controller 1110. The laser signal 1124 is sent through shaping optics 1125 and then to a steering optic 1140, which is also controlled by the system controller 1110. A beam splitter 1150 samples 1162 the output beam 1180 with an alignment sensor 1160. The entire system can be housed in an enclosure 1170 with an optical window 1174.

For the case for long operational range navigation with two GLB-only LRS units, a method may be employed for relative synchronization between the units to deconflict the signals at the receiver. Deconfliction may be employed using forward error correction techniques, using wavelength differentiation between the multiple LRS units, using laser polarization separation, or by time synchronization. In order to perform time synchronization, a communication crosslink between the LRS units may be used. This can be done using a wired transmission (e.g. ground systems), using an RF communication link, or a laser communications link between the LRS units.

Figure 12:
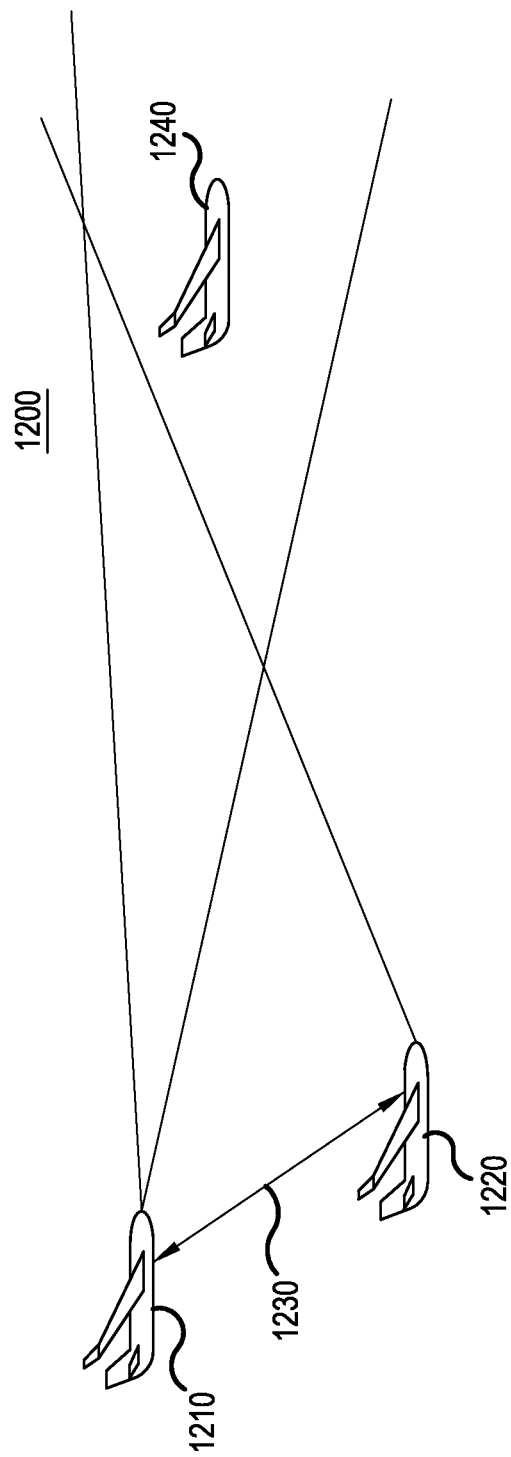
FIG. 12 shows one implementation of the use of a crosslink between two airborne LANS Reference Stations for precision long range navigation.

FIG. 12 is an illustration 1200 of one embodiment using a laser communications link 1230 between two aircraft 1210, 1220 providing overlapping LRS signals 1215, 1225 to a receiving aircraft 1240. In addition to providing multi-unit LRS time synchronization, the laser crosslink 1230 may also provide relative angular information between the LRS units 1210, 1220, which can be used to improve the pointing knowledge of the transmitted GLB beamlets 1215, 1225.

One of the primary benefits of LANS is the broadcast nature of the LRS signals such that can be received by multiple LANS receivers within the navigational coverage area. In the case where the navigational coverage area needs to be dynamic, the LRS may adjust the divergence angle of the GLB beamlets and/or coverage zone.

Figure 13:
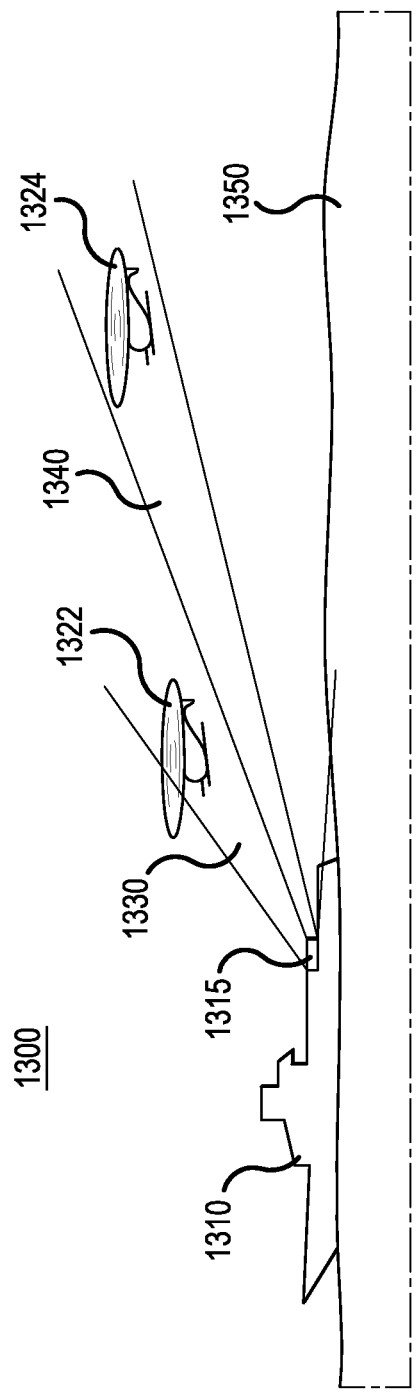
FIG. 13 is an example of how variation of the laser divergence can support an aircraft approach pattern.

FIG. 13 is an illustration 1300 of an embodiment that adjusts the GLB beamlet divergence for a landing rotorcraft at different distances 1322, 1324 on a ship 1310 at sea 1350. In the case where a vehicle is landing or approaching, as the vehicle gets close 1322 to the LRS 1315, its angular extent may be significantly far from the nominal approach path. In this method, as the vehicle approaches the LRS 1315 the GLB coverage area may be expanded 1330 from its nominal coverage area 1340 used when the vehicle is at a longer range 1324. This can be performed either through an operator command to the LRS 1315, or autonomously by vehicle range sensing at the LRS 1315.

Figure 14:
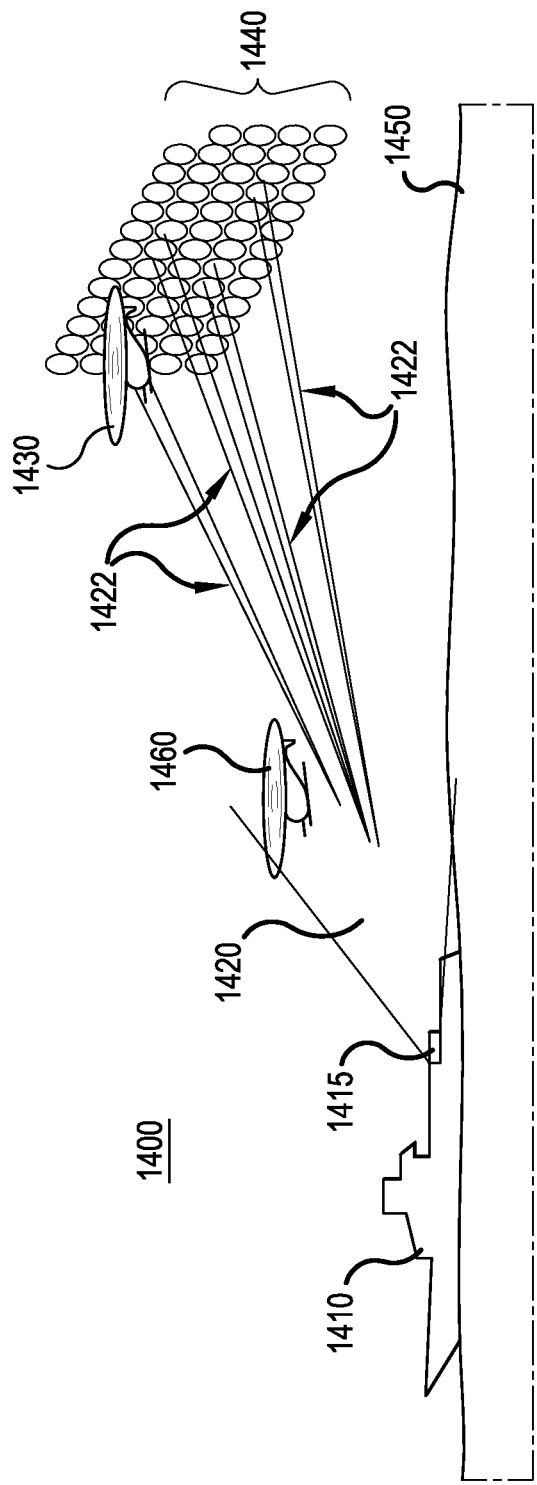
FIG. 14 shows an example of the use of a scanning acquisition mode for initial long range acquisition of an aircraft.

FIG. 14 is an illustration 1400 of long range scanning and target acquisition in a sea faring scenario. LRS 1415 may employed on a ship 1410 where the GLB is reduced from the nominal divergence 1420 for improved atmospheric propagation. The GLB beamlet 1422 is then scanned over a defined large scan area 1440 until the LANS receiver (no shown) on the vehicle 1430 is detected. Detection could occur by means of returned laser energy (as sensed by the ranging sensor or similar optical detector), or by communication channel between the vehicle and the LRS 1415 (providing indication that the GLB signal was received). Once the LANS receiver is initially acquired, a local GLB scan pattern can be projected in the vicinity of the LANS receiver allowing for high energy density and good atmospheric propagation. As the vehicle approaches 1460, the coverage area can be expanded 1420 accordingly.

Figure 15:
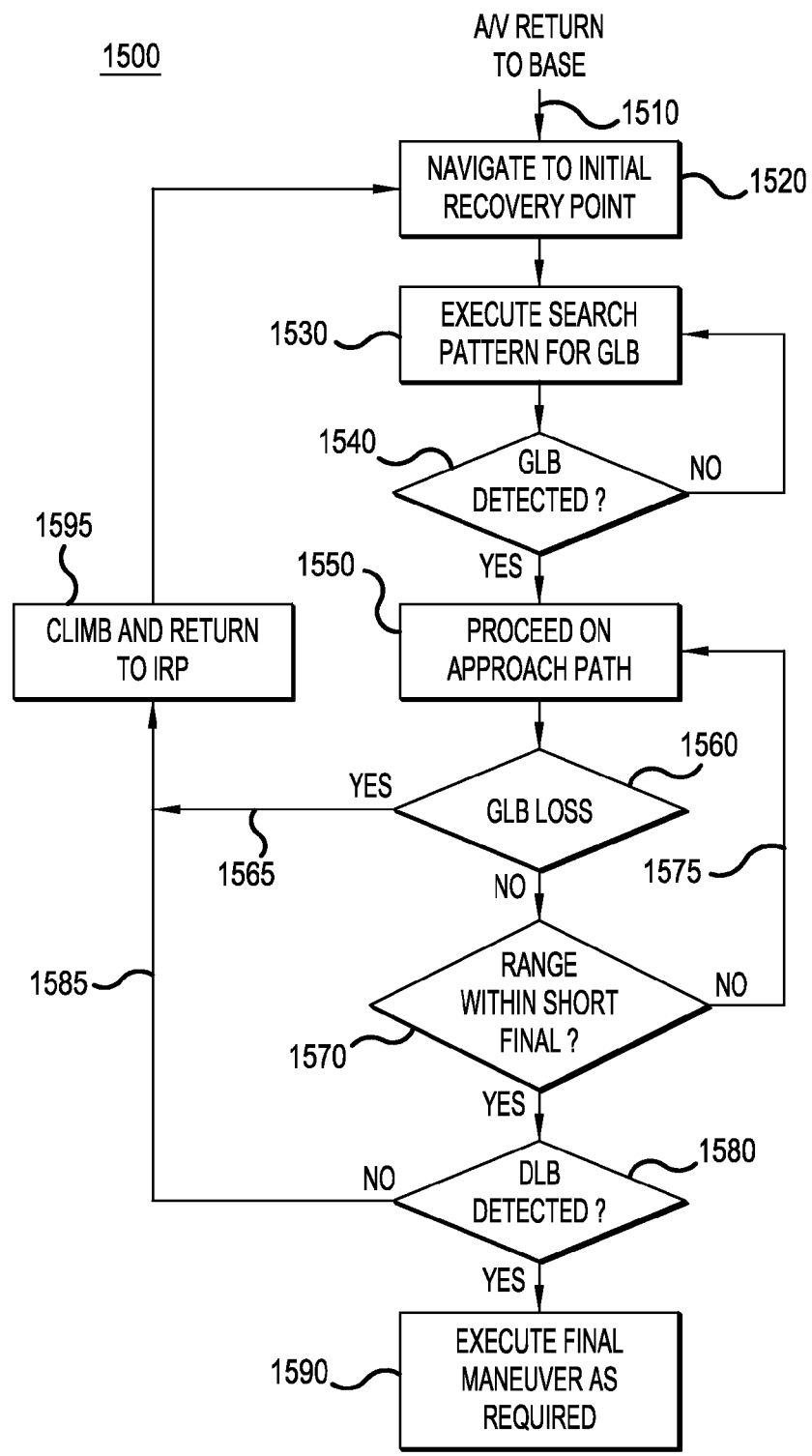
FIG. 15 is a flow chart showing the processes for a recovery initiated aircraft to execute LANS-assisted landing.

FIG. 15 is a flow chart process 1500 of an example of Laser Aided Navigation System (LANS) use for autonomous precision recovery of an aircraft. The process begins when a return to base 1510 is either commanded or initiated by the flight computer. The aircraft then navigates as close as possible to the Initial Recovery Point (IRP) 1520. The aircraft performs a search pattern 1530 until the GLB signal from the proper LRS is detected 1540 by the LANS receiver. Once acquired, the vehicle proceeds on the desired approach path 1550 which may be defined by the GLB or stored within the air vehicle flight computer. During the approach, the vehicle uses various measurements and threshold comparisons, as well as the measurements of angular position and distance from the LRS, as described previously, to maintain a course close to the desired approach path. If range 1570 is within short final (if not within short final, then process 1500 loops 1575 to step 1550 to proceed on the approach path) then the process 1500 proceeds to check if DLB has been detected 1580. If DLB is not detected then the process 1500 jumps 1585 to climb and return to IRP 1595 to restart the process. If DLB is detected 1580, then the process 1500 proceeds to execute the final maneuver 1590.

When the distance falls below a certain threshold, a final maneuver may be performed to achieve final recovery on the ground. If the GLB signal is ever lost 1560 during this process, the vehicle can execute a waive off maneuver 1565 to return to the IRP 1595 and restart the process.

Figure 16:
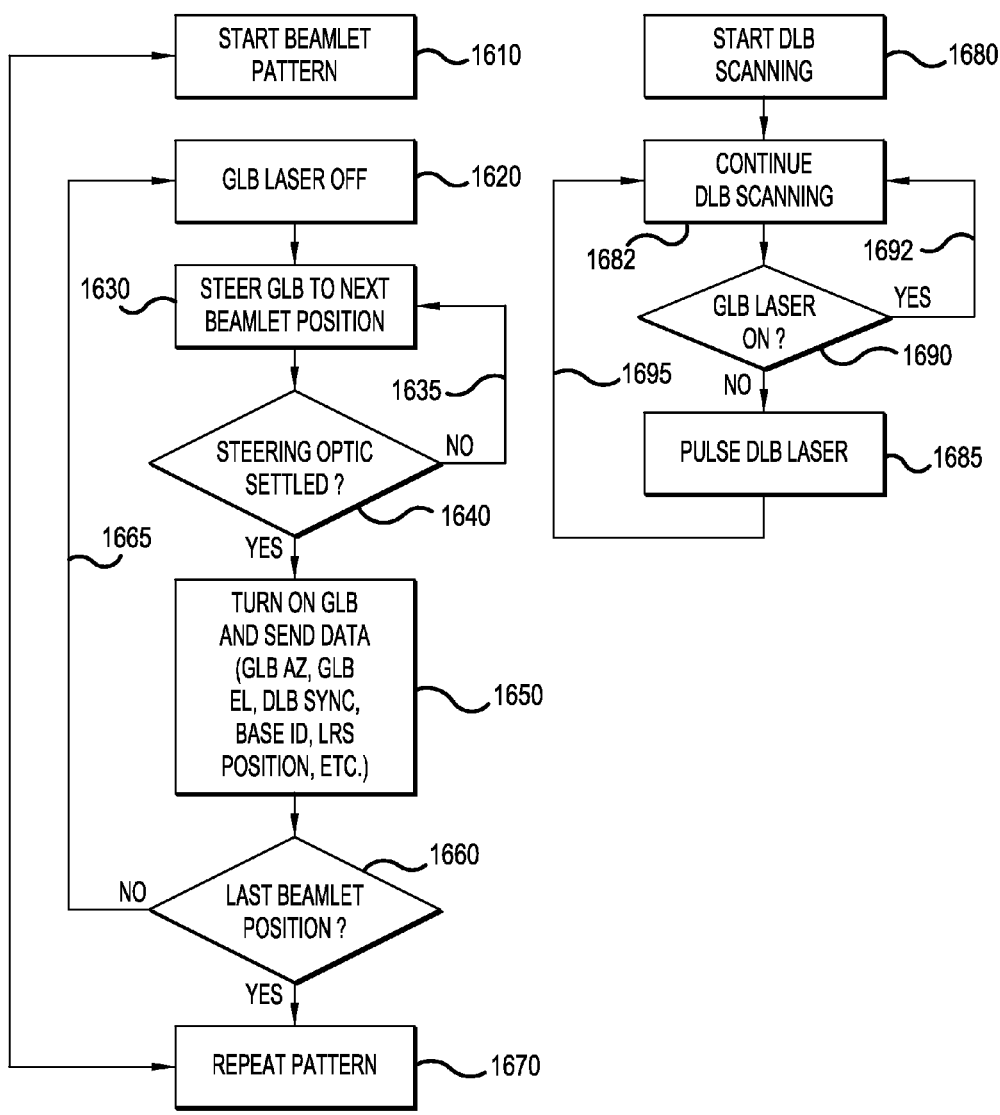
FIG. 16 is a flow chart showing a possible temporal progression for steering information for GLB and DLB beams.

FIG. 16 is a temporal flow progression 1600 of how steering is performed and how necessary information can be encoded in the GLB and DLB beams, in some embodiments of an exemplary system. The progression 1600 relates to an embodiment where the GLB laser is temporally steered.

The beamlet pattern is started 1610 with the GLB laser off 1620, whereupon the GLB is steered 1630 to the next angular position in a chosen scan pattern. The system waits 1635 until the GLB is settled 1640 at the angular position, then the GLB laser sends out the encoded message 1650. The process returns 1665 to generate the next beamlet position until the last beamlet in the pattern 1660 has been transmitted and a full pattern has been generated. The next full pattern 1670 would then start over again.

Concurrently, the DLB is scanned 1680, 1682 with DLB pulses sent 1692 coordinated such that they are propagated when the GLB laser is off 1690 to avoid confliction. If the GLB laser is on during a scheduled DLB pulse time 1685, then the DLB pulse is suppressed and DLB scanning continues 1682. DLB scanning is continuous 1695 during system operation. Depending on the position of the LANS receiver and the current scan position of the DLB, the DLB may be sensed by the LANS receiver. Due to the high relative sampling rate of the LANS sensor, most samples will not measure the presence of the DLB pulse.

The methods described provide accurate measurements of angular position and distance without any RF emissions or communication from the aircraft to the ground. Many of the apparatuses disclosed above for use in effecting this novel method of aircraft recovery are not known in the art, as set forth in the following non-limiting examples.

Laser beam riding has been previously described as a technique for autonomous recovery; in this approach, an aircraft attempts to follow a single stationary laser beam defining the desired flight path. This LANS disclosure, in contrast, allows a vehicle to obtain angular position measurements at arbitrarily large distances from the desired flight path, limited only by the size of the pattern traced by the GLB. In addition, the LANS disclosure provides a distance measurement, a key element of a precision recovery technique.

The LANS disclosure is believed to be the only technique for precision autonomous recovery which does not require any RF emissions, requires no other forms of communication from the aircraft to the ground, and provides both angular position and distance measurements at arbitrary distances from the approach path.

Other non-limiting examples are:

multiple laser sources can be used by the GLB and/or DLB stations, in order to more easily form desired patterns;

multiple sensors may be utilized within the LANS receiver, for example to allow wavelength discrimination if the GLB and DLB use different wavelength lasers; and multiple sensors may be utilized within the LANS receiver to allow for high dynamic range of the laser power associated with vast changes in the operational range.

In some embodiments, the LANS receiver may time integrate or average multiple laser pulses to determine the received beam power. Further, the messages in the laser communication package may be encrypted in a manner preventing unauthorized receipt and use of the signals.

In general, it should be understood that various elements described herein may be implemented in hardware using integrated circuit development technologies, or via some other methods, or the combination of hardware and software objects could be ordered, parameterized, and connected in a software environment to implement different functions described herein. For example, the present application may be implemented using a general purpose or dedicated processor running a software application through volatile or non-volatile memory. Also, the hardware objects could communicate using electrical signals, with states of the signals representing different data.

Additionally, computer/controller aspects of the present disclosure may be embodied as an apparatus that incorporates some software components. Accordingly, some embodiments of the present disclosure, or portions thereof, may combine one or more hardware components such as microprocessors, microcontrollers, or digital sequential logic, etc., such as processor with one or more software components (e.g., program code, firmware, resident software, micro-code, etc.) stored as a non-transitory signal on a tangible computer-readable memory device such as a computer memory device, that in combination form a specifically configured apparatus that performs the functions as described herein.

These combinations that form specially-programmed devices may be generally referred to herein as "modules." The software component portions of the modules may be written in any computer language and may be a portion of a monolithic code base, or may be developed in more discrete code portions such as is typical in object-oriented computer languages. In addition, the modules may be distributed across a plurality of computer platforms, servers, terminals, and the like. A given module may even be implemented such that the described functions are performed by separate processors and/or computing hardware platforms.

It should be further understood that this and other arrangements described herein are for purposes of example only. As such, those skilled in the art will appreciate that other arrangements and other elements (e.g. machines, interfaces, functions, orders, and groupings of functions, etc.) can be used instead, and some elements may be omitted altogether according to the desired results. Further, many of the elements that are described are functional entities that may be implemented as discrete or distributed components or in conjunction with other components, in any suitable combination and location.

Further, although process steps, algorithms or the like may be described in a sequential order, such processes may be configured to work in different orders. In other words, any sequence or order of steps that may be explicitly described does not necessarily indicate a requirement that the steps be performed in that order. The steps of processes described herein may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to the invention, and does not imply that the illustrated process is preferred.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

While various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims.

What is claimed is:

1. A laser navigation system for determining the position of a vehicle or object, comprising:
    an environmental housing with first and second optical windows;
    a first laser source with a steering optic oriented to the first optical window;
    a second laser source with a scanning optic oriented to the second optical window;
    a receiver located on a vehicle or object to be measured, receiving the first and second lasers; and
    a system controller, wherein the controller operates the first laser source with at least one of modulation and signal encoding information and provides steering commands to the steering optic to generate at least three or more adjoining or near-adjoining differentiated steered beams, and operates the second laser source and scanning optic to provide distance measurement information from the signal encoded information, wherein the position of a vehicle or object is determined from its angular location within the differentiated steered beams in combination with the distance measurement information.

2. The system of claim 1, further comprising an adjustable lens between the first laser source and the first optical window, adapted to provide at least one of controllable beam size, beam divergence, and beam shape, wherein the steering optic is at least one of a steerable mirror, rotating polygon mirror, galvanometer, optical modulator and movable lens.

3. The system of claim 2, further comprising a plurality of fixed angled first laser sources.

4. The system of claim 2, further comprising one or more receivers located on a vehicle or object to be measured, wherein the one or more receivers has at least one of multiple receiving optical apertures, multiple optical detectors for sensing received laser energy, optical lenses, optical attenuators, processing electronics for decoding receiver laser messages and computing a vehicle position in a relative or absolute reference frame.

5. The system of claim 1, comprising;
multiple sensors for at least one of increasing the sensing field of view of the receiver, increasing the dynamic range of the receiver, measuring different laser wavelengths, and measuring different laser polarities.

6. The system of claim 1, whereby the receiver is further comprised of multiple optical receivers utilizing different levels of fixed or adjustable optical attenuation and/or polarization through the use of at least one of optical attenuating filters, beam splitters, polarizers, optical shutters, and non-linear photosensitive optics.

7. A method for measuring the line of sight position and physical range of a vehicle or object, comprising:
propagating guidance beams with signal encoded information via a steered laser or multiple lasers at various propagation angles from a transmitting station;
propagating a distance beam via a spatially separated scanned laser within the guidance beams propagation angles from the transmitting station, wherein the distance beam has a defined scanning pattern relative to the guidance beams; and
receiving in a receiving unit, disposed in a vehicle or object displaced from the guidance and distance lasers, the laser received signal from the guidance and distance beams to determine a line of sight position measurement of the vehicle or object and using the signal encoded information in conjunction with the two dimensional position solution relative to the guidance beams for distance measurement.

8. The method of claim 7, wherein the line of sight position measurement is determined from either a differential power measurement of multiple temporally spaced guidance beams, differential power measurement of multiple spatially separated guidance beams, power measurement of a single guidance beam within a field of multiple temporally spaced guidance beams, or power measurement of a single guidance beam within a field of multiple spatially separated guidance beams.

9. The method of claim 7, further comprising:
propagating the guidance and distance beams from multiple transmitting stations; and
triangulating the received signal from the multiple transmitting stations to determine a three dimensional position of the receiver.

10. The method of claim 7, further comprising conveying data within the guidance beams using at least one of time modulation, pulse width modulation, amplitude modulation, phase modulation, frequency modulation, and polarity modulation.

11. The method of claim 10, wherein the data includes at least one of line of sight propagation angles of a respective beam in a relative coordinate frame to a reference station, line of sight propagation angles of a respective beam in an absolute coordinate frame location of a reference station in an absolute reference frame, identifying information of a reference station transmitting the data for deconfliction with other reference stations, angular position or time synchronization of a scanned laser used for distance measurement, communication data for vehicle commanding or reconfiguration, airport or landing area information, and user-configurable data or messaging.

12. The method of claim 10, wherein the data is encrypted to mitigate receipt and use by an unauthorized party.

13. The method of claim 7, further comprising:
shaping the distance beam such that it is narrow in a direction of the scan and covers a wide angle in a direction orthogonal to the scan direction; and
shaping the guidance beams such that a single beam power profile is proportional to an angular offset from a guidance beam's laser center,
wherein a waveband of the beams is in one or more of a visible, infrared, ultraviolet, or extreme ultraviolet wavebands.

14. The method of claim 7, further comprising dynamically altering a beam propagation configuration, including beam divergence, scanning rates and beam angular position, for changes in navigational coverage area, measurement update rate, or atmospheric propagation, as a result of operator input or vehicle/object range measurements.

15. The method of claim 7, further comprising compensating propagation of the distance and guidance beams from motion of a source platform.

16. The method of claim 9, further comprising deconflicting the distance beam from the guidance beam and deconflicting signals from different transmitting stations using at least one of temporal separation, wavelength difference, polarization, forward error correction, and unique data messaging.

17. The method of claim 9, further comprising using an optical, radio frequency, or hard-wired communication link between transmitting stations for time synchronization and/or respective transmitting station orientation.

18. The method of claim 7, further comprising initially acquiring the receiving unit, by transmitting a scanning pattern from the transmitting station, and confirming acquisition through detected returned power or acknowledgement of receipt by the receiving unit via a separate communications link to the transmitting station.

19. A laser navigation system for determining the position of a vehicle or object, comprising:
first environmental housing having a first optical window;
a second environmental housing having a second optical window, wherein the housings are physically separated from each other;
a first laser source in the first housing, with a steering optic oriented to the first optical window;
a second laser source in the second housing, with a steering optic oriented to the second optical window;
a receiver located on a vehicle or object to be measured, receiving the first and second lasers; and
a system controller, wherein the controller operates the first and second laser sources with at least one of modulation and signal encoding information and provides steering commands to the steering optic to generate at least three or more adjoining or near-adjoining differentiated steered beams from each laser, wherein the position of a vehicle or object is determined from triangulating its location within the differentiated multiple sets of steered beams and from the signal encoded information.

* * * * *